(12) United States Patent
Gan

(10) Patent No.: US 6,871,879 B2
(45) Date of Patent: Mar. 29, 2005

(54) FAN DUCT ASSEMBLY

(75) Inventor: Li Yuan Gan, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 690 days.

(21) Appl. No.: 09/751,004

(22) Filed: Dec. 28, 2000

(65) Prior Publication Data
US 2002/0093196 A1 Jul. 18, 2002

(51) Int. Cl.[7] .............................................. H05K 7/20
(52) U.S. Cl. ...................... 285/189; 285/424; 361/690; 361/695
(58) Field of Search ............................... 285/189, 202, 285/203, 424; 361/678, 690, 695; 174/16.1

(56) References Cited

U.S. PATENT DOCUMENTS

| | | | | |
|---|---|---|---|---|
| 4,961,125 A | * | 10/1990 | Jordan et al. | 361/690 |
| 5,707,282 A | * | 1/1998 | Clements et al. | 361/690 |
| 6,244,953 B1 | * | 6/2001 | Dugan et al. | 361/695 |
| 6,313,989 B1 | * | 11/2001 | Kuang | 361/690 |
| 6,400,568 B1 | * | 6/2002 | Kim et al. | 361/690 |
| 6,449,157 B1 | * | 9/2002 | Chu | 174/16.3 |
| 6,501,656 B1 | * | 12/2002 | Peng et al. | 361/695 |
| 6,504,718 B2 | * | 1/2003 | Wu | 361/695 |
| 6,646,876 B2 | * | 11/2003 | Carr et al. | 361/695 |

* cited by examiner

Primary Examiner—David Bochna
(74) Attorney, Agent, or Firm—Wei Te Chung

(57) ABSTRACT

A fan duct assembly includes a fan duct (200), a panel (600), and a locking plate (700). One end of the fan duct defines a rectangular opening (204) with a peripheral flange (220). A pair of ribs (224) is formed on one side of the flange. A pair of L-shaped catches (602) is stamped from the panel. The catches abut against the ribs, to retain the side of the flange. The locking plate is attached to the panel opposite to the catches. The locking plate includes a base (710) and a vertical portion (720) extending from the base. An L-shaped resilient tab (730) is inclinedly stamped from the locking plate, to resiliently abut against the side of the fan duct and the flange. A pair of resilient feet (716) extends from opposite sides of the base, each foot having a free end portion resiliently abutting against the flange.

7 Claims, 6 Drawing Sheets

FAN DUCT ASSEMBLY

BACKGROUND OF THE INVENTION

1. Field of the Invention

The present invention relates to a fan duct assembly, and more particularly to a fan duct assembly incorporating a resilient locking plate which absorbs vibration.

2. Related Art

In a conventional heat dissipation assembly incorporating a fan duct, the fan duct is mounted to a computer enclosure using a plurality of screws. An example of a conventional assembly is disclosed in U.S. Pat. No. 5,917,697. A hood connects one end of a fan duct to a fan. The hood is attached to the fan by a plurality of screws. A fitting connects another end of the fan duct to a frame board. A pair of screws extends through the fitting and the frame board, thereby attaching the frame board to a panel of a computer enclosure. However, assembly and disassembly requires a tool, which makes these processes cumbersome and time-consuming. Moreover, rotation of fan blades of the fan and airflow in the fan duct 15 both cause vibration of the fan duct. Thus, over time, the screws become loose and the whole assembly generates excessive noise.

An improved fan duct assembly which overcomes the above problems is desired.

SUMMARY OF THE INVENTION

Accordingly, an object of the present invention is to provide a fan duct assembly incorporating a locking plate for readily attaching a fan duct to a computer panel, and readily detaching the fan duct therefrom.

Another object of the present invention is to provide a fan duct assembly incorporating a locking plate which absorbs vibration.

To achieve the above-mentioned objects, a fan duct assembly comprises a fan duct, a panel, and a locking plate. One end of the fan duct defines a rectangular opening with a peripheral flange. A pair of ribs is formed on one side of the flange. A pair of L-shaped catches is stamped from the panel. The catches abut against inner sides of the ribs, to retain the side of the flange. The locking plate is adapted to be attached to the panel opposite to the catches. The locking plate comprises a base and a vertical portion extending from the base. An L-shaped resilient tab is inclinedly stamped from the locking plate, to resiliently abut against the side of the fan duct and the flange. A pair of resilient feet extends from opposite sides of the base, each foot having a free end portion bent slightly upwardly to resiliently abut against the flange. The tab and the feet cooperate to resiliently retain the side of the fan duct therebetween.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
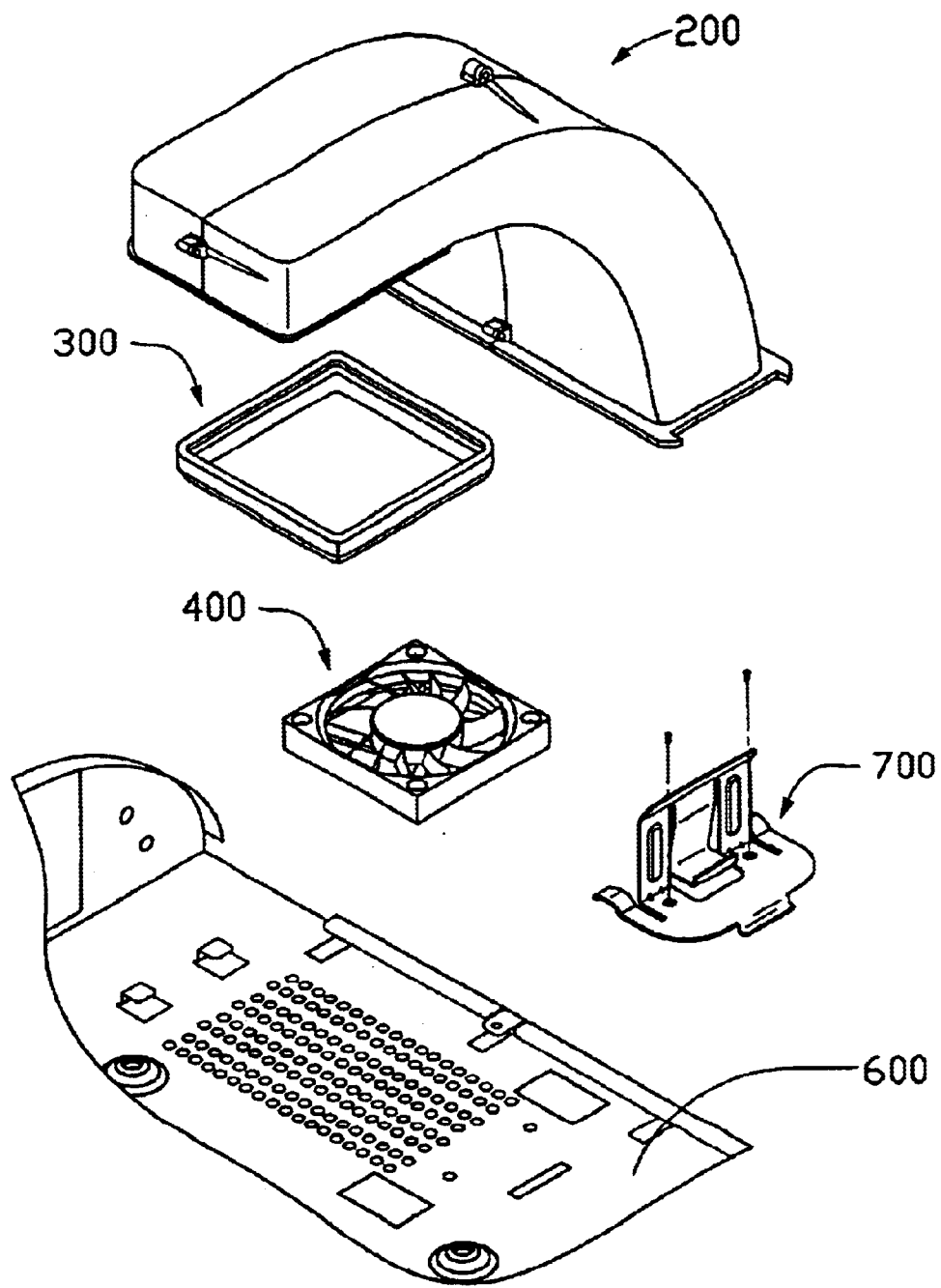
FIG. 1 is an exploded view of a fan duct assembly in accordance with the present invention, together with a frame and a fan.
Figure 2:
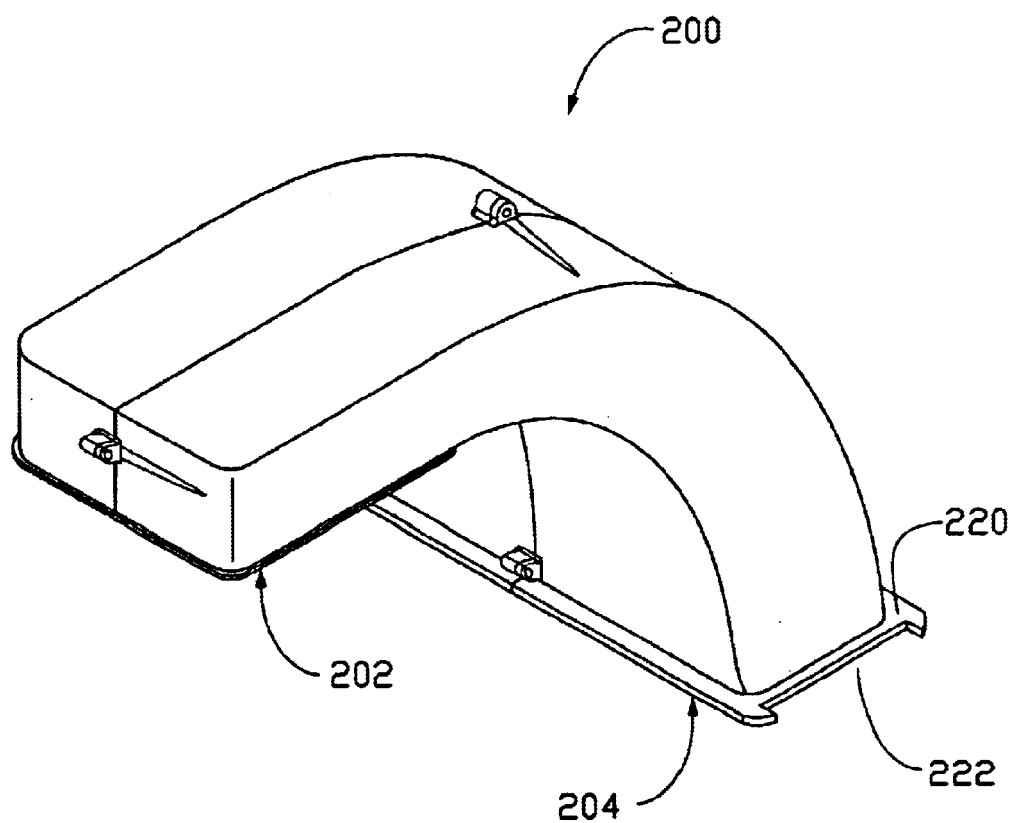
FIG. 2 is a perspective view of a fan duct of FIG. 1.
Figure 3:
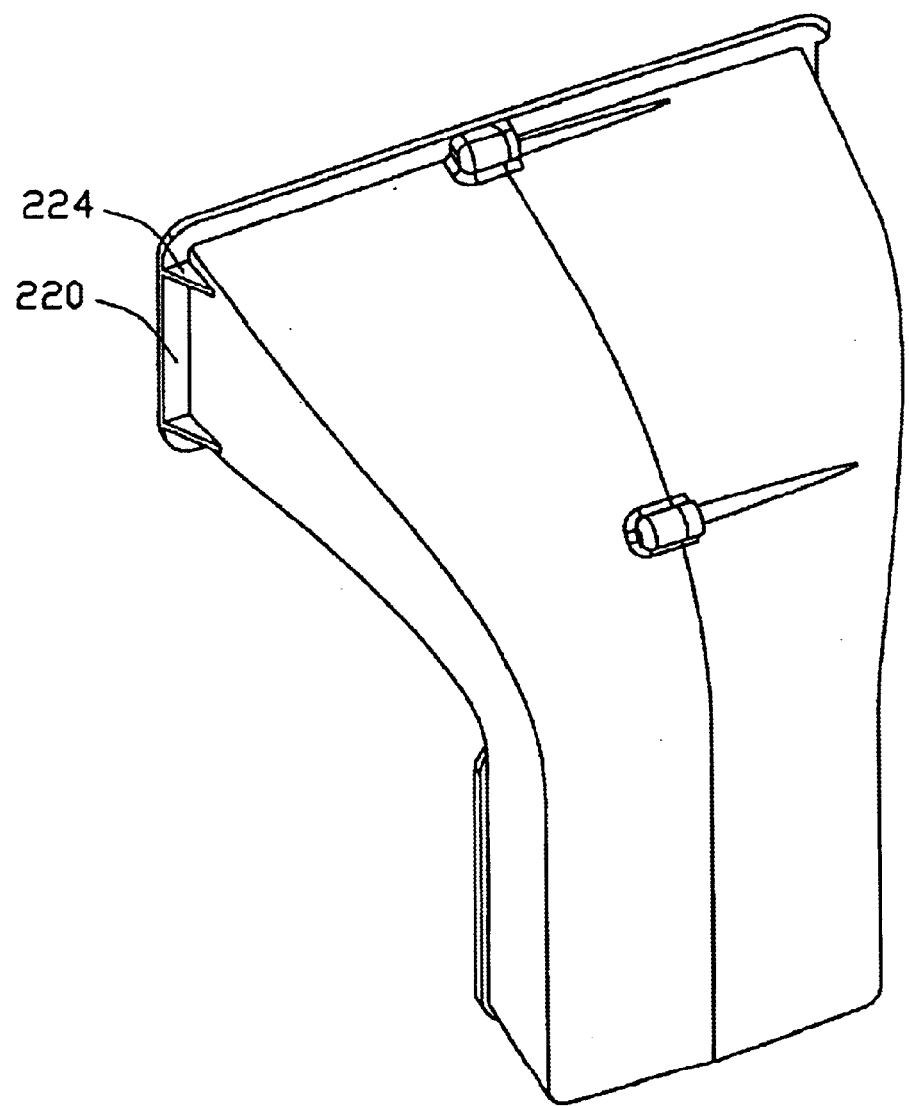
FIG. 3 is similar to FIG. 2, but viewed from another direction.

Referring to FIGS. 1–3, a fan duct assembly in accordance with the present invention comprises a fan duct 200, a panel 600 of a computer enclosure (not shown), and a resilient locking plate 700.

The fan duct 200 comprises two symmetrical tubes connected together. A cross-section of the fan duct 200 is rectangular. One end of the fan duct 200 defines a rectangular first opening 202. The fan duct 200 at the first opening 202 is connected to a fan 400 by a frame 300. An opposite end of the fan duct 200 defines a second opening 204. A peripheral flange 220 extends perpendicularly outwardly from the fan duct 200 at the second opening 204. A cutout 222 is defined in one side of the flange 220. A pair of triangular ribs 224 is formed at an opposite side of the flange 220. The ribs 224 connect a side wall of the fan duct 200 to the flange 220.

Figure 4:
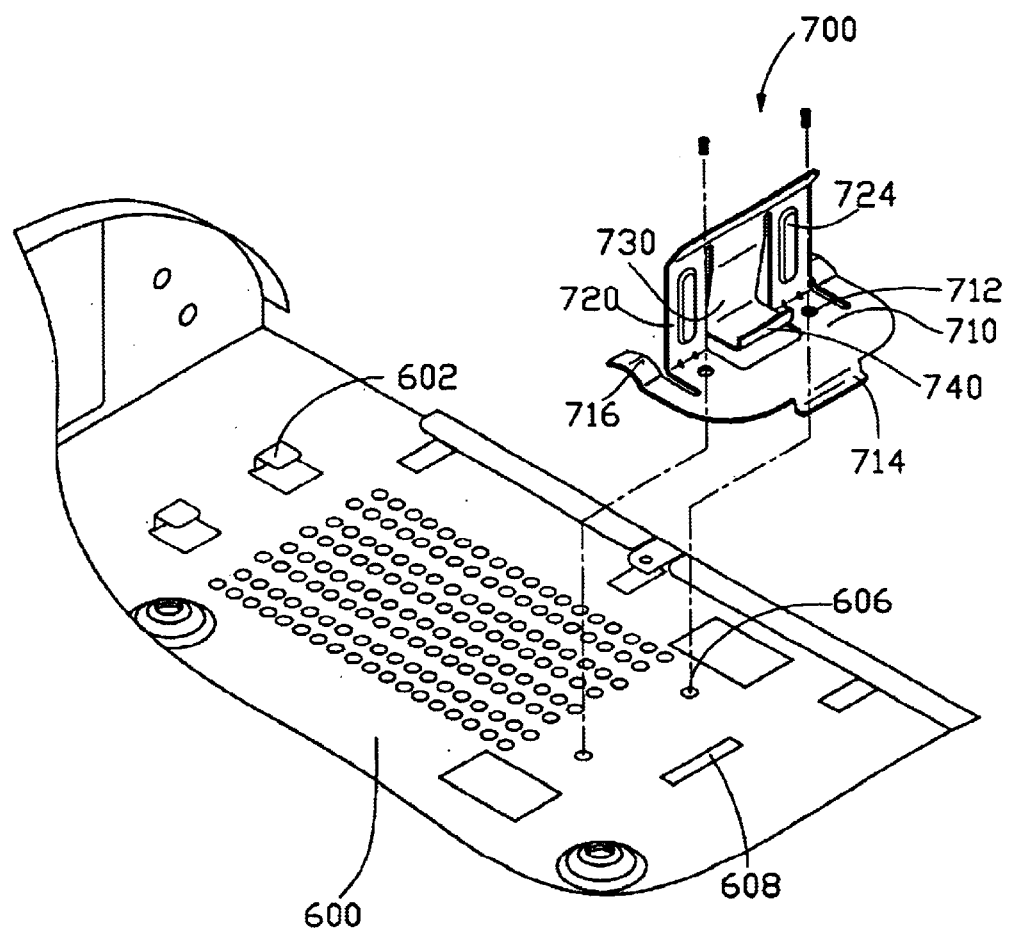
FIG. 4 is a perspective view of a locking plate and a panel of a computer enclosure of FIG. 1.

Referring also to FIG. 4, the panel 600 of the enclosure is stamped to form a pair of L-shaped catches 602. Each catch 602 extends upwardly from the panel 600, and then perpendicularly inwardly. The catches 602 are parallel to each other, and correspond to the ribs 224 of the fan duct 200.

The resilient locking plate 700 is generally L-shaped, and includes a base 710 and a vertical portion 720 extending perpendicularly from the base 710. A lip (not labeled) is bent inclinedly from a top edge of the vertical portion 720, for guiding installation of the fan duct 200. A generally L-shaped resilient tab 730 is stamped from the locking plate 700, with a top end thereof integrally connecting with the vertical portion 720. A bottom portion of the tab 730 bends slightly in a direction opposite to the direction in which the lip (not labeled) is bent. A handle 740 extends upwardly from a bottom end of the tab 730. A pair of reinforcing ribs 724 is formed on the vertical portion 720 on opposite sides of the tab 730 respectively. A pair of resilient feet 716 respectively extends from opposite sides of the base 710, in the same direction in which the bottom portion of the tab 730 bends. A free end portion of each foot 716 is bent slightly upwardly. A pair of first apertures 712 is defined in the base 710 on opposite sides of the tab 730 respectively, corresponding to a pair of second apertures 606 defined in the panel 600. A stepped fixing portion 714 depends from an edge of the base 710 opposite the vertical portion 720, corresponding to an opening 608 defined in the panel 600.

Figure 5:
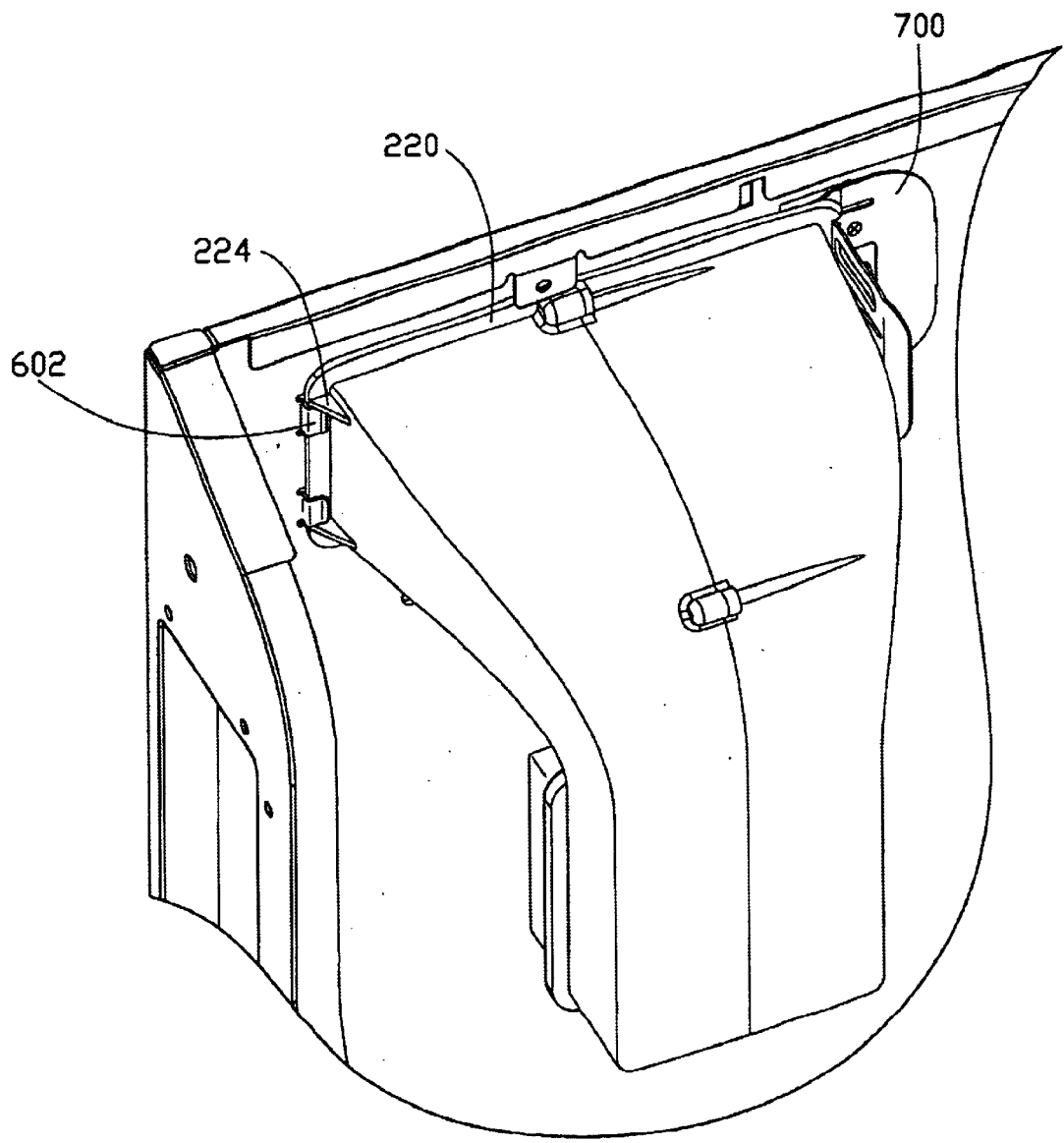
FIG. 5 is an assembled view of FIG. 1, but viewed from another direction.
Figure 6:
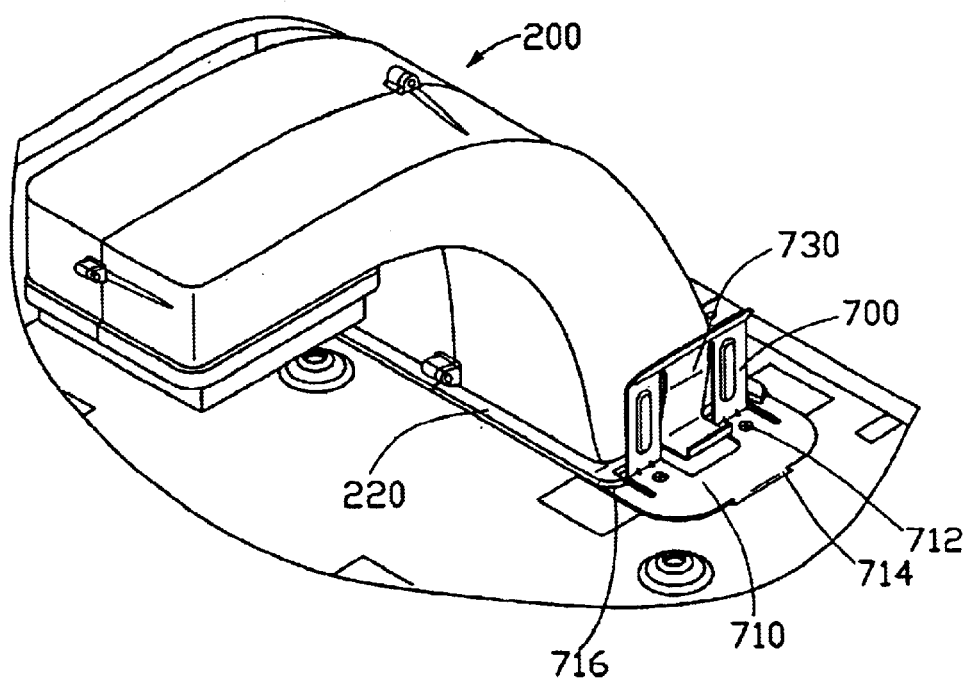
FIG. 6 is an assembled view of FIG. 1.

Referring to FIGS. 5 and 6, in assembly, the locking plate 700 is placed onto the panel 600. The fixing portion 714 of the locking plate 700 is inserted into the opening 608 of the panel 600. A pair of rivets (not labeled) is respectively extended through the first apertures 712 of the locking plate 700 and the corresponding second apertures 606 of the panel 600, thereby securing the locking plate 700 to the panel 600. The fan duct 200 is tilted to one side, and one side of the flange 220 of the fan duct 200 is inserted under the catches 602 of the panel 600. The catches 602 abut against inner sides of the ribs 224 of the fan duct 200 and against a top surface of the flange 220, thereby retaining the side of the flange 220. Then the other side of the fan duct 200 is pressed downwardly to urge the fan duct 200 at the cutout 222 to interferentially pass beyond the tab 730 of the locking plate 700. The tab 730 then resiliently abuts against the side of the fan duct 200 and the flange 220 at the cutout 222. The feet 716 of the locking plate 700 simultaneously resiliently abut against the flange 220 at opposite ends of the cutout 222. The tab 730 and the feet 716 cooperate to resiliently retain the side of the fan duct 200 therebetween, and thereby absorb vibration efficiently.

In disassembly, the handle 740 of the locking plate 700 is pulled away from the fan duct 200. This releases one side of the flange 220 of the fan duct 200 from the locking plate 700. Then the other side of the flange 220 is withdrawn from the catches 602 of the panel 600.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A fan duct assembly comprising:
   a fan duct having first and second flanges extending outwardly from an opening thereof;
   a panel having at least one catch for engaging with the first flange of the fan duct; and
   a locking plate attached to the panel opposite to the at least one catch, the locking plate comprising a base and a vertical portion extending from the base, a resilient tab being formed from the vertical portion for pressing the second flange of the fan duct and thereby absorbing vibration; wherein
   the tab of the locking plate is generally L-shaped, with a toy end integrally connecting with the vertical portion of the locking plate and a bottom portion bent slightly toward the fan duct.

2. The fan duct assembly as described in claim 1, wherein at least one rib is formed on the first flange of the fan duct, and each catch of the panel abuts against one corresponding rib and a top surface of the flange to retain one side of the fan duct.

3. The fan duct assembly as described in claim 1, wherein a handle extends upwardly from a bottom end of the tab of the locking plate.

4. The fan duct assembly as described in claim 1, wherein a stepped fixing portion depends from an edge of the base of the locking plate, to extend through an opening defined in the panel.

5. The fan duct assembly as described in claim 1, wherein at least one reinforcing rib is formed at opposite sides of the vertical portion of the locking plate.

6. A fan duct assembly comprising:
   a fan duct having first and second flanges extending outwardly from an opening thereof;
   a panel having at least one catch for engaging with the first flange of the fan duct; and
   a locking plate attached to the panel opposite to the at least one catch, the looking plate comprising a base and a vertical portion extending from the base, a resilient tab being formed from the vertical portion for pressing the second flange of the fan duct and thereby absorbing vibration; wherein
   at least one resilient foot respectively extends from opposite sides of the base of the locking plate toward the fan duct, and wherein a free end portion of each foot is bent slightly upwardly to press against the second flange of the fan duct.

7. A fan duct assembly comprising:
   a fan duct having first and second flanges extending outwardly from an opening thereof;
   a panel having at least one catch for engaging with the first flange of the fan duct; and
   a locking plate attached to the panel opposite to the at least one catch, the locking plate comprising a base and a vertical portion extending from the base, a resilient tab being formed from the vertical portion for pressing the second flange of the fan duct and thereby absorbing vibration; wherein
   at least one rivet extends through at least one first aperture defined in the locking plate and through at least one corresponding second aperture defined in the panel, thereby securing the locking plate to the panel.

* * * * *